United States Patent [19]

Svoen

[11] Patent Number: 5,432,439
[45] Date of Patent: Jul. 11, 1995

[54] ARRANGEMENT IN A CURRENT DETECTION CIRCUIT

[75] Inventor: Geir Svoen, Oslo, Norway

[73] Assignee: ABB Energi AS, Norway

[21] Appl. No.: 170,263

[22] PCT Filed: Jun. 16, 1992

[86] PCT No.: PCT/NO92/00107
  § 371 Date: Dec. 29, 1993
  § 102(e) Date: Dec. 29, 1993

[87] PCT Pub. No.: WO93/01502
  PCT Pub. Date: Jan. 21, 1993

[30] Foreign Application Priority Data

Jul. 1, 1991 [NO] Norway .................................. 912576

[51] Int. Cl.⁶ .............................................. G01R 33/00
[52] U.S. Cl. ...................................... 324/127; 336/73; 336/200; 323/357
[58] Field of Search ......................... 323/356, 357, 358; 336/73, 75, 200, 225; 324/127

[56] References Cited

U.S. PATENT DOCUMENTS 5,010,314 4/1991 Estrov .................................. 336/198
5,321,380 6/1994 Godek .................................. 336/232

FOREIGN PATENT DOCUMENTS 0157881 10/1985 European Pat. Off. ...... G01R 15/02
3741333 6/1989 Germany ...................... H01F 40/14
1404719 9/1975 United Kingdom ......... H01F 40/06

Primary Examiner—Kenneth A. Wieder
Assistant Examiner—Mark Wardas
Attorney, Agent, or Firm—Volpe and Koenig

[57] ABSTRACT

The present invention relates to an arrangement in a current detection circuit. There is a primary coil for the current to be detected, a separate transformer core which is influenced by the current of the primary coil, a secondary coil conducting a transformed secondary current, as well as a tertiary coil connected to an operational amplifier including a feedback resistor and constituting a current-voltage converter circuit with an input resistance of nearly zero ohms.

20 Claims, 1 Drawing Sheet

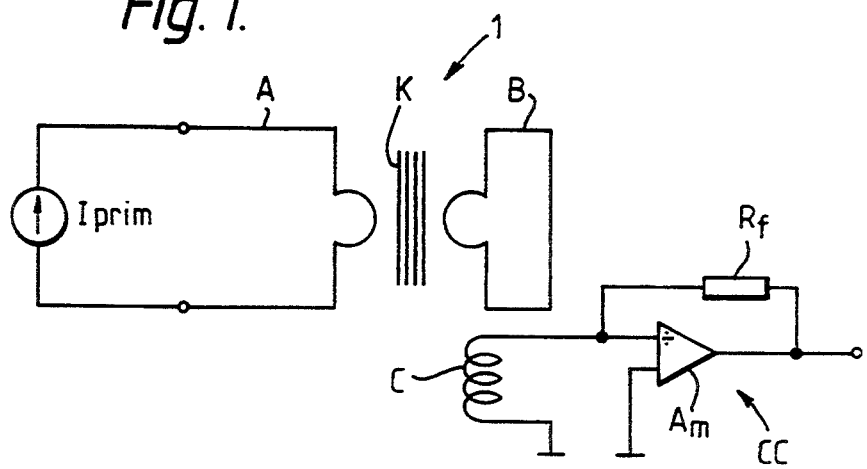
Fig. 1.
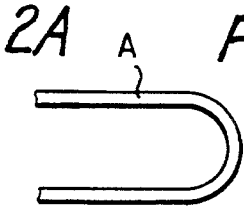
Fig. 2A
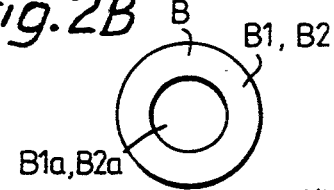
Fig. 2B
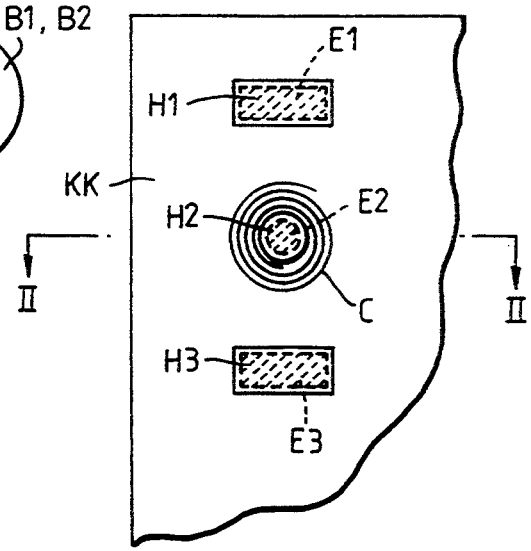
Fig. 2C
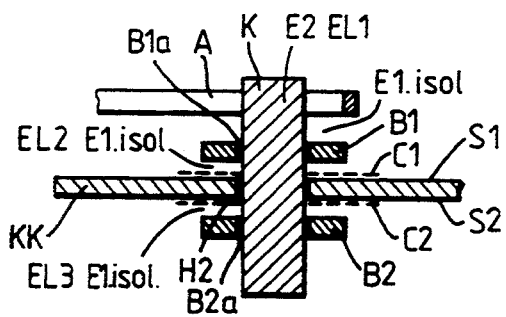
Fig. 2D  II-II

ARRANGEMENT IN A CURRENT DETECTION CIRCUIT

FIELD OF THE INVENTION

The present invention relates to an arrangement in a current detection circuit, comprising a primary coil for the current to be detected, a separate transformer core which is influenced by the current of the primary coil, a secondary coil conducting a transformed secondary current, as well as a tertiary coil connected to an operational amplifier including a feed-back resistor and constituting a current-voltage converter circuit with an input resistance of nearly zero ohms.

PRIOR ART

From GB 1 404 719 there is disclosed a current measuring transformer for obtaining a voltage proportional to the current to be measured. This prior art current measuring transformer comprises a closed transformer core associated with a secondary winding which is directly short-circuited without any load impedance, and having a pick-up winding with terminals across which appears the voltage which is proportional to the current to be measured. However, the secondary winding is formed by the metal rail through which the primary current is flowing. Further, the prior art core is made up of plates and bolts which are solidly attached to the metal rail itself. Consequently, this type of measuring transformer will not be adaptable for integration in a circuit board.

From EP 0 157 881 B1 (Toda) there is disclosed a current detection circuit of the type cited in the above preamble.

According to teaching it is suggested that the prior art transformer further comprises a tertiary coil being provided with two terminals, and having these two terminals electrically connected by a conductor, so as to provide a short-circuited tertiary coil. However, the production of such a transformer requires a number of terminals, especially for the tertiary coil, i.e. a physical interface between the terminals thereof and the conductor which is to short-ciruit the tertiary coil. The prior art suggestion of having a physical interface between the terminals of the tertiary coil and the associated short-circuiting conductor is further substantiated by the fact that the prior art secondary coil and the prior art tertiary coil should be wound with the same material in parallel disposition and with substantially the same number of turns should and still further substantiated by suggesting that terminals should be provided at both ends and a middle point of one series coil, one side of which constituting the prior art secondary coil and the other side of which constituting the tertiary coil.

Such a prior art current detection circuit would not pave the way for manufacturing a current detection circuit in an integral manner on a circuit board, since this prior art transformer including a plurality of terminals and physical interfaces to be provided and connected to appropriate conductors during the manufacturing thereof, would be highly ineffective by requiring a plurality of process steps and accordingly a high output cost.

Further, this prior art detection circuit would not give the artisan any instructions for arriving at a solution which is temperature-independent in a more rational and effective manner. Although it is true that the prior art current detection circuit according to EP 0 157 881 B1 suggests that the secondary coil and the tertiary coil should be of materials of different resistance-temperature coefficient, this will only give a desired temperature characteristic to the current detection circuit, but not a highly efficient temperature-equalizing circuit.

SUMMARY OF THE INVENTION

An object of the present invention is to provide a current detection circuit in which the elements thereof can easily be integrated in a circuit board.

A further object of the present invention is to provide a current detection circuit in which one or more coils can be provided by punching, said punching operation being very cost favourable compared with the manufacturing of wound coils.

Yet another object of the present invention is to provide a current detection circuit in which the measuring coil or tertiary coil can be integrated directly in a circuit board.

Still another object of the present invention is to provide a current detection circuit which inherently renders an automatic temperature correction, meaning that the measured values are not temperature-dependent.

In a current detection circuit of the type as mentioned in the preamble, these objects are achieved in accordance with the present invention in that the secondary coil comprises at least one endless and terminal-free disc-shaped member.

Thereby is avoided the need of a pre-wound secondary coil with terminals, said disc-shaped member rendering an interface-free connection between the other elements of the current detection circuit.

Consequently, the primary coil, the secondary coil and the tertiary coil can easily be adapted for being integrated in a circuit board, and most appropriately the secondary coil may comprise two separate endless and terminal-free disc-shaped members.

Preferably, the two separate disc-shaped members could then be located on each side of a circuit board, each disc-shaped member being shaped as a flat ring having its respective central opening aligned around an appropriate opening in said circuit board.

The disc-shaped member or members constituting the secondary coil can together with the primary coil easily be manufactured by punching, which punching process is very time and cost consuming compared with for example the manufacturing of wound coils including terminal points therein.

A further feature of the present invention is to the fact that the tertiary coil is directly integrated in a circuit board, especially as one or more copper paths in said circuit board.

Further, the tertiary coil could then comprise an integrated wound path on each side of the circuit board, preferably wound around the same opening therein as encircled by said disc-shaped members and at an appropriate distance therefrom.

It is to be understood that the core could comprise two substantially E-shaped ferrite cores, the legs thereof fitting into appropriate openings in said circuit board, including said opening around which the disc-shaped members as well as the tertiary coil are arranged.

An important feature of the present current detecting circuit is that the secondary coil or coils and said tertiary coil are made of the same material, said coils being arranged such in relation to eachother as to have a good thermal connection therebetween, such that the induced voltage resulting from an alteration of the resistance of the secondary coil or coils results in a corresponding alteration in the tertiary coil. Thereby, there is achieved an automatic temperature correction inherent in the electro-mechanical structure of the circuit board current detection circuit according to the present invention.

In a preferred embodiment it is according to the invention suggested that between the primary coil and the secondary coil or coils there should be provided electrical insulation, and between the secondary coil or coils and the tertiary coil there is provided electrical but not thermal insulation.

It should also be noted that the ratio between the current in the secondary coil or coils and the current in the tertiary coil should be adapted in relation to the cross section of said coils, as well as to the length and effective number of turns of said tertiary coil.

Consequently, according to the invention there is provided a secondary shunt which can be included in a very simple electro-mechanical structure, especially in a circuit board configuration, rendering low material costs and a simple connection for the further electronic treatment of the signals detecting thereby.

The solution is also favourable as regards thermal stability, and theoretically no temperature deviation should occur.

Embodiments according to the present invention also cater for good electro-magnetic compatibility (EMC) screening without further components, since the secondary shunt operates as a screen.

Further features and advantages provided by the present invention will appear from the following description including the enclosed drawing, as well as from the attached patent claims.

BRIEF DISCLOSURE OF THE DRAWING

FIG. 1 illustrates schematically the principle of the present invention.

FIG. 2, including further FIGS. 2A, 2B, 2C or 2D illustrates a practical solution in an embodiment of the present invention, and details of elements included therein.

DISCLOSURE OF EMBODIMENTS

In FIG. 1 there is schematically illustrated the principle of the present invention, or the so-called secondary shunt method, in which a current detection circuit I according to the present invention comprises a primary coil A for the current $I_{prim}$ to be detected, a separate transformer core K which is influenced by the current $I_{prim}$ of the primary coil A, a secondary coil B conducting a transformed secondary current, as well as a tertiary coil C connected to an operational amplifier $A_m$ including a feed-back resistor $R_f$ and constituting a current-voltage converter circuit CC with an input resistance of nearly zero ohms. It is to be understood that the tertiary coil C operates as a pick-up of the field induced in the transformer core material due to the voltage drop in the secondary coil or shunt B.

The pick-up coil C conducts a very small current which is adapted to normal signal levels for electronic controls. The ratio between the current in the secondary coil or shunt B (per definition identical primary current—magnetic current in the core) and the pick-up core C is regulated by the ratio between the cross sections thereof, as well as the length and the effective number of turns of the pick-up coil or tertiary coil C.

This C achieved by maintaining the pick-up coil is short-circuited by the electronic circuit CC.

The pick-up coil or tertiary coil C is most appropriately of the same material as the secondary coil B. Provided good thermal connection between the tertiary coil C and the secondary coil B, any alteration in the induced voltage as a consequence of the change of resistance in the secondary coil B, will also entail a corresponding change in resistance in the pick-up or tertiary coil C.

Consequently, the net result on the measurement will be zero, provided there is established a good thermal connection and provided the same material is used in the secondary coil B as in the tertiary coil C.

In FIG. 2 there is illustrated a specific solution which is designed for direct integration in a circuit board KK.

The primary coil A is preferably made from copper and manufactured by a punching process, whereas the secondary coil B comprises at least one endless and terminal-free disc-shaped member, in the present embodiment two separate endless and terminal-free disc-shaped members B1 and B2, respectively. In the present embodiment also the secondary coils B1 and B2 are made from copper and manufactured by a punching process, and both the primary coil A and the secondary coils constitute each one single turn for conducting a large current. Generally, the secondary coil B could be a flat copper ring, but in the embodiment illustrated in FIG. 2 there is provided two disc-shaped members B1 and B2, respectively, on each side, S1 and S2, respectively, of the circuit board KK, and each disc-shaped member is shaped as a flat ring having its respective central opening B1a and B2a, respectively, aligned around an appropriate opening H2 in said circuit board KK.

The tertiary coil or the pick-up coil C is directly integrated in the circuit board KK, as ordinary copper paths in said board, each path C1 and C2, respectively, being arranged on each side of the circuit board KK, and being connected in series for rendering a large resistance.

The tertiary coil paths C1 and C2 provided on a respective side of the circuit board KK, are preferably wound around the same opening H2 therein as said disc-shaped members B1 and B2, and at an appropriate distance therefrom.

As a whole, this high precision current detection circuit according to the present invention may be realized in a circuit board by providing only punched components as well as appropriate ferrite cores. In the present embodiment it is appropriate to utilize two substantially E-shaped ferrite cores, the legs thereof E1, E2, E3 fitting into appropriate openings H1, H2, H3, respectively, in said current board KK.

By using punched elements and ferrite cores and especially by providing the secondary coils as two individual single-turn, terminal-free and interface-free components, the present invention has paved the way for a simple and efficient circuit board construction of a current detection circuit.

Further, since the tertiary or pick-up coil C conducts a very small current which is adapted to normal signal levels for electronic circuitry (analogue level), and since the ratio between the current of the secondary coils B1, B2 and the current of the tertiary coil C is adapted by the ratio between the cross section of the coils, as well as the length and the effective number of turns of said pick-up coil C, there is allowed for a large range of individual components which can be used for an effective and cost saving production of a circuit board current detection circuit. By choosing the material of the pick-up coil C as the same as that of the secondary coil B, and by mounting said coils in such a relation to each other as to have a good thermal connection therebetween, it can easily be achieved that the induced voltage resulting from an alteration of the resistance of the secondary coils B1, B2 results in a corresponding alteration in the tertiary coil C.

Not only the secondary coil or coils B1, B2 and the tertiary coil C can be adapted for direct integration in a circuit card KK, but also the primary coil K, which means that the production line for any circuit board current detection circuit can be very effective and cost saving.

Between the primary coil A and the secondary coils B1, B2 there is provided electrical insulation EL1, and between the secondary coils B1, B2 and the tertiary coil C1, C2 there is provided electrical, but not thermal insulation EL2 and El3, respectively.

The present current detection circuit finds application for measuring currents within a large range, for example in the range of 10–60 amps, and within a large range of voltage, for example 220–1000 volts, or more than 12 kV. Special fields of application can be current meters, wattmeters, or measuring current in roebel rods in generators.

I claim:

1. A current detection circuit (1) comprising a primary coil (A) for conducting current ($I_{prim}$) to be detected; a separate transformer core (K) influenced by current ($I_{prim}$) conducted by the primary coil (A); a secondary coil (B) for conducting a transformed secondary current; a tertiary coil (C) connected to an operational amplifier ($A_m$) including a feed-back resistor ($R_f$) and constituting a current/voltage converter circuit (CC) with an input resistance of nearly zero ohms; characterized in that the secondary coil (B) comprises at least one endless and terminal-free conductor which is disc-shaped.

2. The circuit of claim 1 wherein the primary coil (A), the secondary coil (B) and the tertiary coil (C) are adapted for being integrated in a circuit board (KK).

3. The circuit of claim 2 wherein the secondary coil (B) comprises two separate endless and terminal-free conductors which are disc-shaped.

4. The circuit of claim 3, characterized in that said two separate disc-shaped conductors (B1, B2) are located opposite sides (S1, S2) of a circuit board (KK), each disc-shaped conductor comprising a flat ring (B1, B2) having its respective central opening (B1a, B2a) aligned around an appropriate opening (H2) in said circuit board (KK).

5. The circuit of claim 4, characterized in that the tertiary coil (C) is directly integrated in a circuit board (KK) comprising at least one copper path (C1, C2) in said circuit board.

6. The circuit of claim 5 wherein the tertiary coil (C) comprises an integrated wound path of the tertiary coil (C1, C2) on each side of the circuit board (KK), wound around the same opening (H2) as said disc-shaped conductors (B1, B2) and at an appropriate distance therefrom.

7. The circuit of claim 6, characterized in that each said secondary endless and disc-shaped conductor (B; B1, B2) is arranged so as to constitute an EMC screening.

8. The circuit of claim 7 wherein said core (K) comprises two substantially E-shaped ferrite cores, the legs (E1, E2, E3) thereof fitting into appropriate openings (H1, H2, H3) in said circuit board (KK).

9. The circuit of claim 8, characterized in that the secondary coil(s) (B; B1, B2) and said tertiary coil (C) are made of the same material, said coils being arranged such in relation to each other as to have a good thermal connection therebetween, such that the induced voltage resulting from an alteration of the resistance of the secondary coil(s) (B; B1, B2) results in a corresponding alteration in the tertiary coil (C; C1, C2).

10. The circuit of claim 9, characterized in that between the primary coil (A) and the secondary coil (B; B1, B2) there is provided electrical insulation (EL1), and that between the secondary coil (B; B1, B2) and the tertiary coil (C) there is provided electrical but not thermal insulation (EL2, EL3).

11. The circuit of claim 10, characterized in that the ratio between the current in the secondary coil (B; B1, B2) and the current in the tertiary coil (C; C1, C2) is adapted in relation to the cross section of said coils, as well as to the length and effective number of turns of said tertiary coil (C, C1, C2).

12. The circuit of claim 1 wherein the secondary coil (B) comprises two separate endless and terminal-free conductors which are disc-shaped.

13. The circuit of claim 1, characterized in that the tertiary coil (C) is directly integrated in a circuit board (KK) comprising at least one copper path (C1, C2) in said circuit board.

14. The circuit of claim 3, characterized in that the tertiary coil (C) is directly integrated in a circuit board (KK) comprising at least one copper path (C1, C2) in said circuit board.

15. The circuit of claim 14 wherein the tertiary coil (C) comprises an integrated wound path of the tertiary coil (C1, C2) on each side of the circuit board (KK), wound around the same opening (H2) as said disc-shaped conductors (B1, B2) and at an appropriate distance therefrom.

16. The circuit of claim 1 wherein the tertiary coil (C) comprises an integrated wound path of the tertiary coil (C1, C2) on each side of the circuit board (KK), wound around the same opening (H2) as said disc-shaped conductors (B1, B2) and at an appropriate distance therefrom.

17. The circuit of claim 1, characterized in that each said secondary endless and disc-shaped conductor (B; B1, B2) is arranged so as to constitute an EMC screening.

18. The circuit of claim 1 wherein said core (K) comprises two substantially E-shaped ferrite cores, the legs (E1, E2, E3) thereof fitting into appropriate openings (H1, H2, H3) in said circuit board (KK).

19. The circuit of claim 1, characterized in that the secondary coil(s) (B; B1, B2) and said tertiary coil (C) are made of the same material, said coils being arranged such in relation to each other as to have a good thermal connection therebetween, such that the induced voltage resulting from an alteration of the resistance of the secondary coil(s) (B; B1, B2) results in a corresponding alteration in the tertiary coil (C; C1, C2).

20. The circuit of claim 19, characterized in that between the primary coil (A) and the secondary coil (B; B1, B2) there is provided electrical insulation (EL1), and that between the secondary coil (B; B1, B2) and the tertiary coil (C) there is provided electrical but not thermal insulation (EL2, EL3).

* * * * *